(12) United States Patent
Obeng et al.

(10) Patent No.: US 6,406,609 B1
(45) Date of Patent: Jun. 18, 2002

(54) METHOD OF FABRICATING AN INTEGRATED CIRCUIT

(75) Inventors: Jennifer S. Obeng; Yaw S. Obeng, both of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/513,390

(22) Filed: Feb. 25, 2000

(51) Int. Cl.[7] ............................. C25D 5/02; H05K 3/00
(52) U.S. Cl. .................. 205/125; 205/296; 205/298
(58) Field of Search ..................... 205/125, 157, 205/291, 296, 297, 298

(56) References Cited

U.S. PATENT DOCUMENTS

| | | | |
|---|---|---|---|
| 3,770,597 A | * 11/1973 | Tixier | .................. 205/296 |
| 4,110,176 A | * 8/1978 | Creutz et al. | .............. 205/296 |
| 4,134,803 A | 1/1979 | Eckles et al. | |
| 4,347,108 A | 8/1982 | Willis | |
| 4,430,173 A | 2/1984 | Boudot et al. | |
| 4,479,852 A | * 10/1984 | Bindra et al. | ................ 205/81 |
| 4,673,467 A | 6/1987 | Nee | |
| 4,673,469 A | 6/1987 | Beach et al. | |
| 4,975,159 A | 12/1990 | Dahms | |
| 5,151,170 A | * 9/1992 | Montgomery et al. | ...... 205/298 |
| 5,174,886 A | 12/1992 | King et al. | |
| 5,232,575 A | 8/1993 | Dodd | |
| 5,252,196 A | 10/1993 | Sonnenberg et al. | |
| 5,417,841 A | * 5/1995 | Frisby | ...................... 205/296 |
| 6,113,771 A | * 9/2000 | Landau et al. | .............. 205/123 |
| 6,224,737 B1 | * 5/2001 | Tsai et al. | .................... 205/123 |

FOREIGN PATENT DOCUMENTS

| | | |
|---|---|---|
| EP | 0 419 845 A2 | 3/1991 |
| EP | 0 632 146 A1 | 4/1995 |
| EP | 0 280 408 A1 | 8/1998 |
| GB | 2 069 536 A | 8/1981 |
| GB | 2 097 020 A | 10/1982 |
| GB | 2 273 941 A | 6/1994 |

* cited by examiner

Primary Examiner—Bruce F. Bell
Assistant Examiner—Wesley A. Nicolas

(57) ABSTRACT

The present invention provides an aqueous electroplating solution. The aqueous electroplating solution includes a copper salt comprising a weight by weight percent of the electroplating solution between about 0.1% to about 2.5%. The electroplating solution also includes an inorganic acid having a dissociation constant of less than about 2.0, and comprising a weight by weight percent of the electroplating solution between about 0.1% to about 10%. The electroplating solution further includes a hydrogenated halide and a modulator, each that comprises a weight by weight percent of the electroplating solution between about 0.0001% to about 1%.

20 Claims, 5 Drawing Sheets

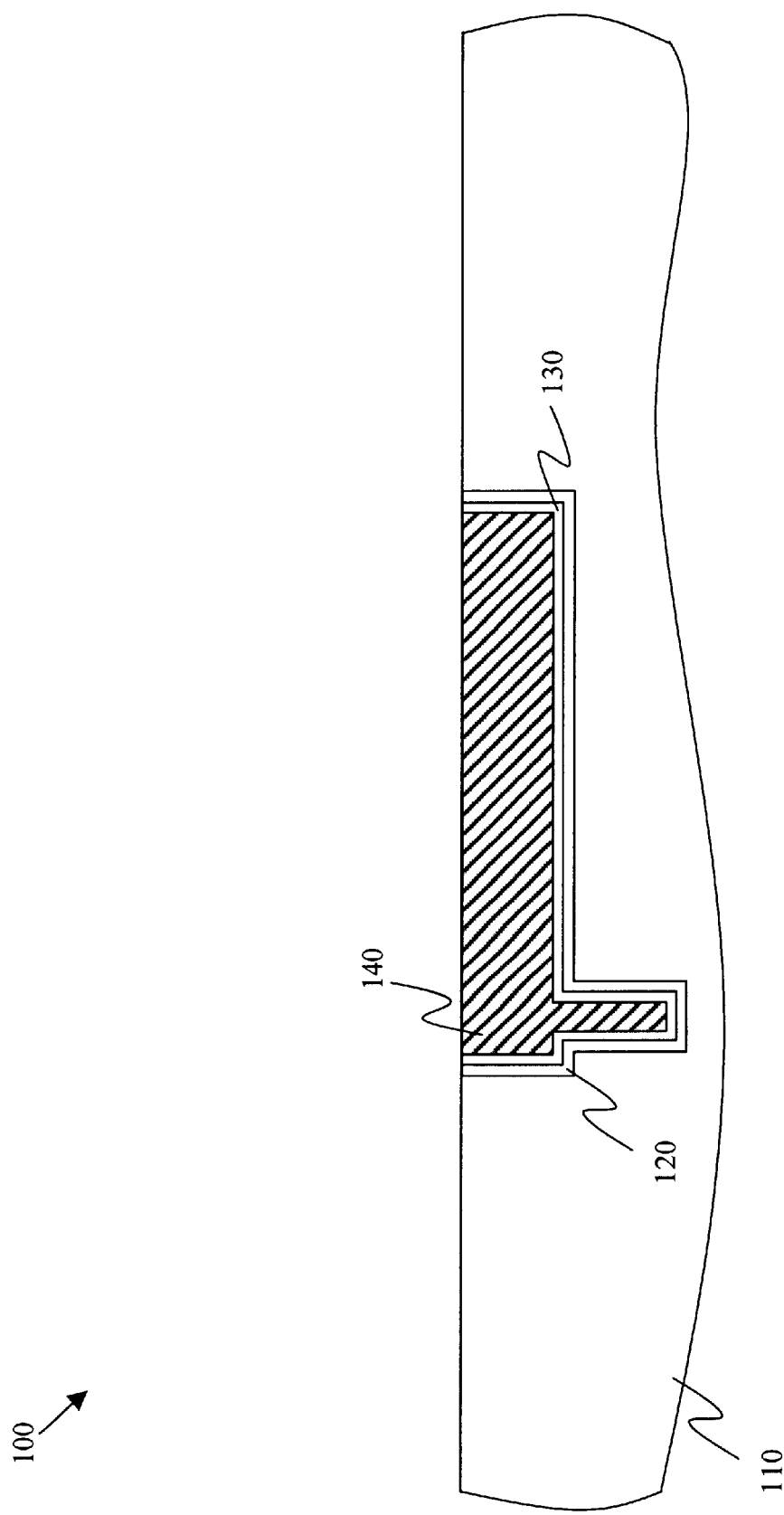

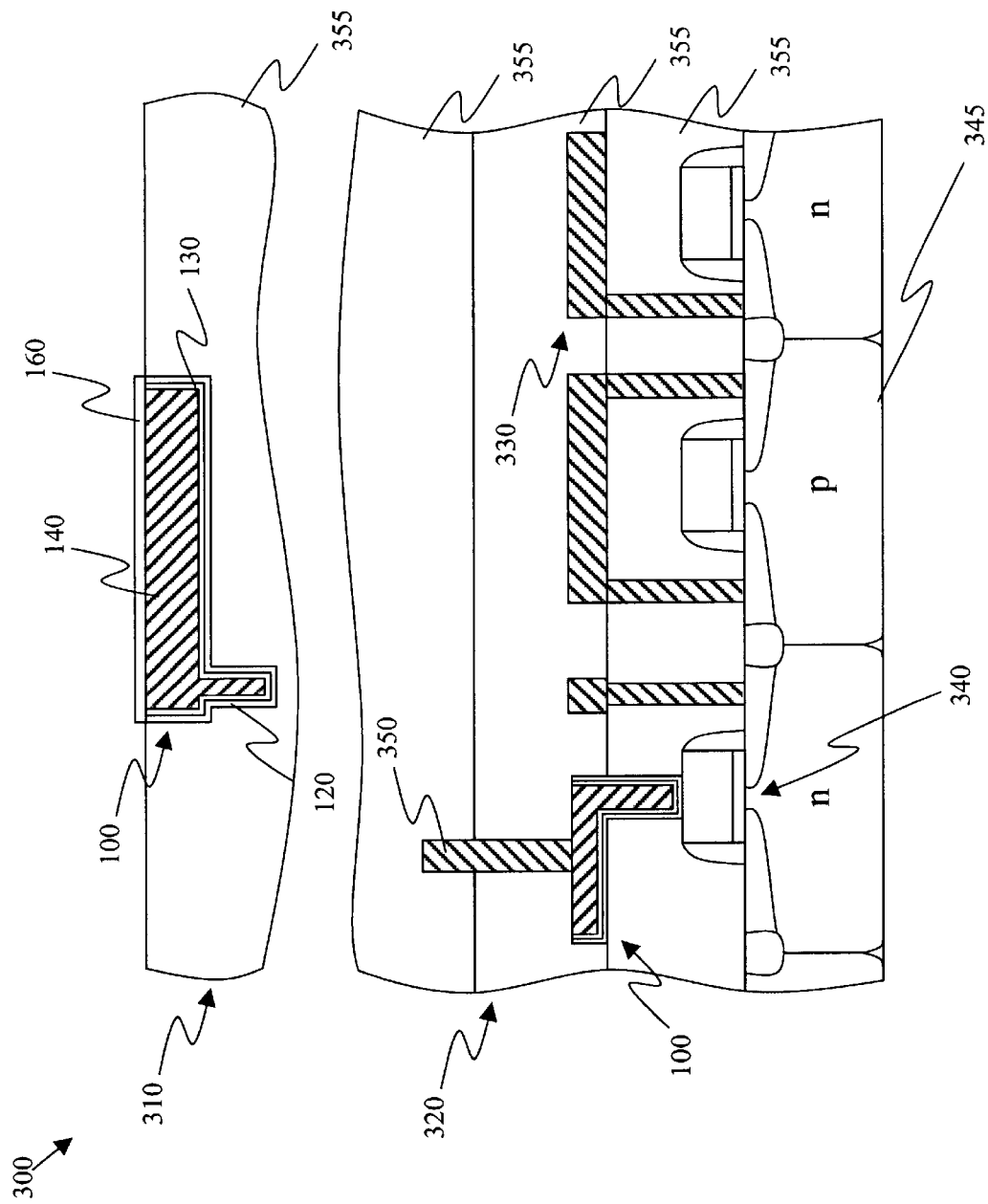

METHOD OF FABRICATING AN INTEGRATED CIRCUIT

TECHNICAL FIELD OF THE INVENTION

The present invention is directed, in general, to a copper-based electroplating solution and, more specifically, to a copper-based electroplating solution for electroplating copper onto a semiconductor wafer to form an copper layer on which an under bond metal may be formed.

BACKGROUND OF THE INVENTION

The number of levels within ultra large-scale integration circuits (ULSIs) over the last decade has increased tremendously. Current ULSIs are approaching six levels. This increase in levels has required interconnect technologies to adjust accordingly. A major limiting factor in interconnect technology is RC delay, introduced by the coupling characteristics of metals and insulators. An efficient interconnect scheme, for advanced ULSIs, requires materials with low effective time constants. In this regard, metals with low resistivity, such as copper and other noble metals, are emerging as materials of choice. However, even though other materials may be used, copper is currently the interconnect material of choice.

Unfortunately, however, there are integration problems associated with the use of copper in forming interconnects within the integrated circuit. One such problem is the difficulty in packaging the device wafers. In order to make copper metalization manufacturable, the ability to package the finished wafers is of utmost importance. Current wiring techniques, such as gold wire-bonding and flip chip technologies, may not work on copper metalized wafers. Thus, there is a need for under bond metalization (UBM).

Critical to UBM technology are the mechanical properties of the outermost copper layer, to which the UBM will be attached. Specifically, the adhesion at the UBM/Cu and Cu/dielectric interface must be robust. These interfaces must survive thermomechanical cycling, which deforms the interconnect. Thus, the outermost copper layer must be engineered to afford high yield strengths as well as good adhesion to the underlying dielectric and the UBM.

Critical to the yield strength and adhesion strength of the outermost copper layer are the processing conditions for the copper. Such processing conditions include the electroplating bath composition, chemistry of the surface and texture of the seed layer. Currently, the semiconductor manufacturing industry uses the same electrodeposition solution for all levels within the integrated circuit. However, the current electrodeposition solutions do not provide adequate mechanical yield strength to the electroplated copper that is used to support the under bond metal. Thus, when the current electroplated copper interconnect is subjected to thermomechanical cycling, the yield strength and adhesion strength may decrease to an unacceptable level.

Accordingly, what is needed in the art is an electrodeposition solution that may be used in current copper interconnect technology and that does not experience the mechanical yield strength problems associated with the prior art solution.

SUMMARY OF THE INVENTION

To address the above-discussed deficiencies of the prior art, the present invention provides an aqueous electroplating solution. In a preferred embodiment, the aqueous electroplating solution includes a copper salt, an acid that has a dissociation constant of less than about 2, a hydrogenated halide and a modulator that comprises a weight by weight percent of the electroplating solution that is less than about 1%. In a preferred embodiment, the copper salt comprises a weight by weight percent of the electroplating solution that ranges from about 0.1% to about 2.5%. The acid comprises a weight by weight percent of the electroplating solution that ranges from about 0.1% to about 10%, and the hydrogenated halide and the modulator each comprise a weight by weight percent of the electroplating solution that ranges from about 0.0001% to about 1%.

Thus, in one aspect, the present invention provides an aqueous electroplating solution that yields a superior electroplating solution that can be used to form an improved interconnect structure. This unique solution provides an electroplated interconnect structure with beneficial yield and adhesion strength values such that the electroplated interconnect structure can provide a support structure for an under bond metal (UBM).

In one embodiment, the copper salt is copper sulfate, which preferably comprises a weight by weight percent of the electroplating solution of about 0.3%. In another embodiment, the acid is sulfuric acid, which in a preferred embodiment, comprises a weight by weight percent of the electroplating solution of about 0.08%. The acid, however, in other embodiments may be any of a number of strong acids, including inorganic acids or organic acids that have disassociation constants about equal to or less than sulfuric acid. In yet another embodiment, the hydrogenated halide may be a hydrogen bromide, hydrogen chloride, or hydrogen iodine. The hydrogenated halide preferably comprises a weight by weight percent of the electroplating solution of about 0.001%, respectively.

In another embodiment, the modulator comprises a brightener. The brightener preferably includes an acidic aqueous solution of formaldehyde, urea, beta-diketonates, thiourea, diamino-urea, or thiophene. In one particular embodiment, the brightener is a derivative of 2,2'-thiobisalkyl acetoacetate or 2,2'-aminobisalkyl having a general formula: $(X-[CH_2(CH_2)_n-O-C(O)\ CH_2C(O)\ CH_3]_2)$, where X=S or N respectively. When X=S and n=2, in another embodiment, the 2,2'-thiobisalkyl acetoacetate is 2,2'-thiobisethyl acetoacetonate. Furthermore, when X=N and n=2, in another embodiment, the 2,2'-aminobisalkyl acetoacetate is 2,2'aminobisethyl acetoacetonate. However, in a preferred embodiment, the brightener includes an acidic aqueous solution comprising alkylthiol, having a general formula: $(R-SH)$, where $R=CH_3(CH_2)_n-CH_2$ when $n \geq 2$.

The modulator, in an alternative aspect, may function as a leveler. Furthermore, the modulator may be a mixture of the above discussed brightener, and the leveler and may further comprise a weight by weight percent of the electroplating solution less than about 0.01%. Additionally, the leveler may include the brightener and a water soluble polymer. The water soluble polymer may be a polyalcohol, or more specifically saturated and unsaturated aliphatic polyalcohols, e.g. a polyalkylene glycol.

Another aspect of the present invention provides a method of fabricating an integrated circuit on a semiconductor wafer. The method includes (1) forming transistors, such as metal oxide semiconductor (CMOS) transistors or bipolar transistors, on a semiconductor wafer, (2) forming a dielectric layer over the transistors, (3) forming an opening in the dielectric layer, (4) placing the semiconductor wafer into the aqueous electroplating solution described above, (5) electroplating copper in the opening, and (6) interconnecting the transistors to form an operative integrated circuit.

One embodiment further includes, depositing a barrier layer within the opening. In yet another embodiment, the method further includes depositing a copper seed layer on the barrier layer. The barrier layer may be tantalum/tantalum nitride, titanium/titanium nitride, tantalum/tantalum silicon nitride, or titanium/titanium silicon nitride.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 2C illustrates the completed electroplated interconnect structure, after being removed from the aqueous electroplating solution and a conventional chemical mechanical polishing process; and FIG. 3 illustrates the completed electroplated interconnect structures of FIGS. 1 and 2C, within a conventional integrated circuit (IC).

DETAILED DESCRIPTION

Figure 1:
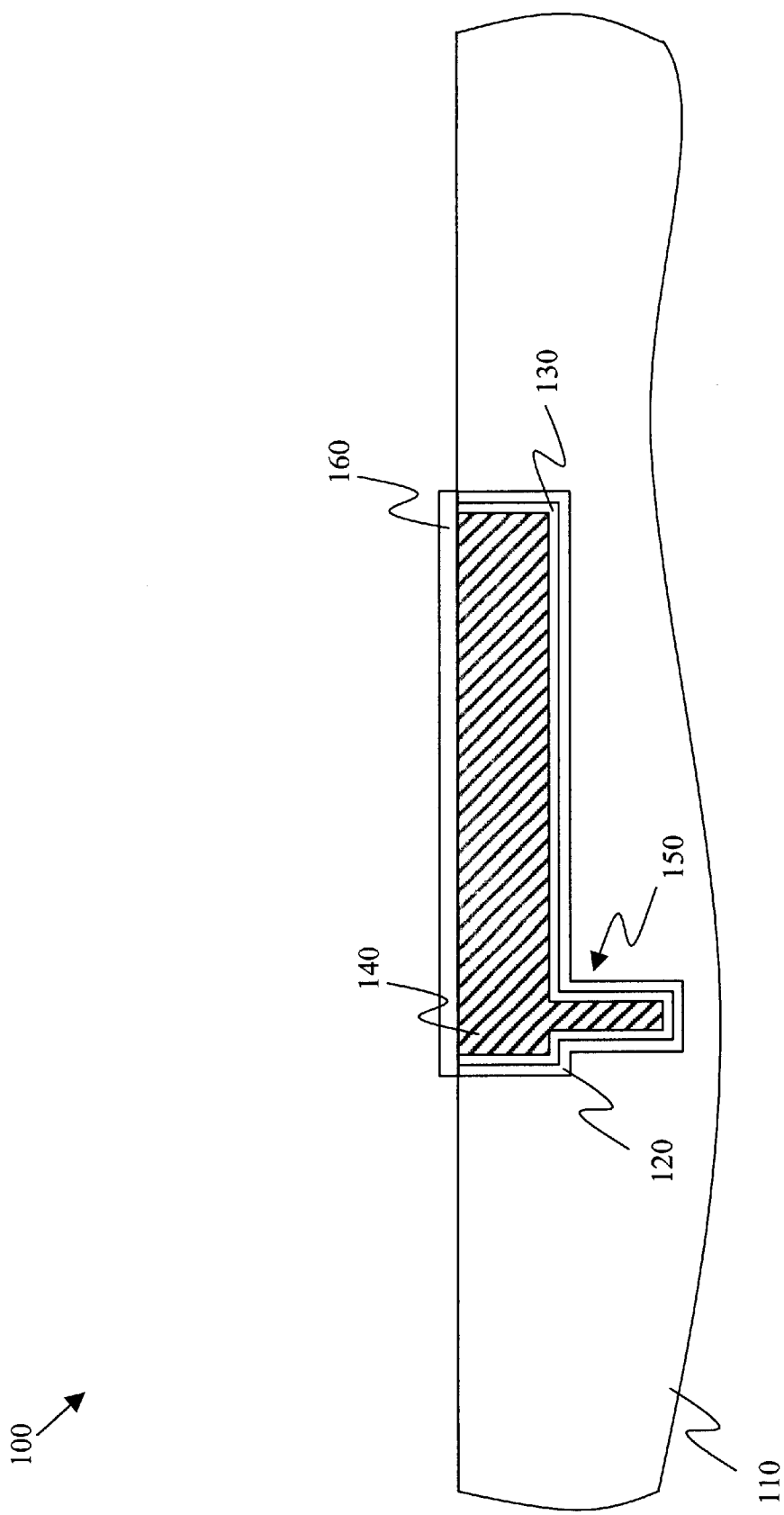
FIG. 1 illustrates a partial sectional view of a completed electroplated interconnect structure, as covered by the present invention.

Referring initially to FIG. 1, illustrated in a partial sectional view of a completed electroplated interconnect structure 100 covered by the present invention. The completed electroplated interconnect structure 100, which is formed in a dielectric material 110, includes a barrier layer 120, a seed layer 130 and an electroplated copper layer 140, all of which are located within an opening 150. The opening 150, which in the illustrated embodiment is a dual damascene trench, is located within the dielectric layer 110. One having skill in the art understands that any other similar opening, including a conventionally formed single damascene trench, may be used instead of the illustrated dual damascene trench. Over the completed electroplated interconnect structure 100, is located an under bond metalization pad 160 onto which a wire may be connected.

As illustrated, the electroplated interconnect structure 100 is located within the dielectric layer 110 on the upper most level of an integrated circuit (IC). However, in alternative embodiments, the electroplated interconnect structure 100, including the barrier layer 120, seed layer 130 and electroplated copper layer 140, may be located on any level within the IC.

Figure 2A:
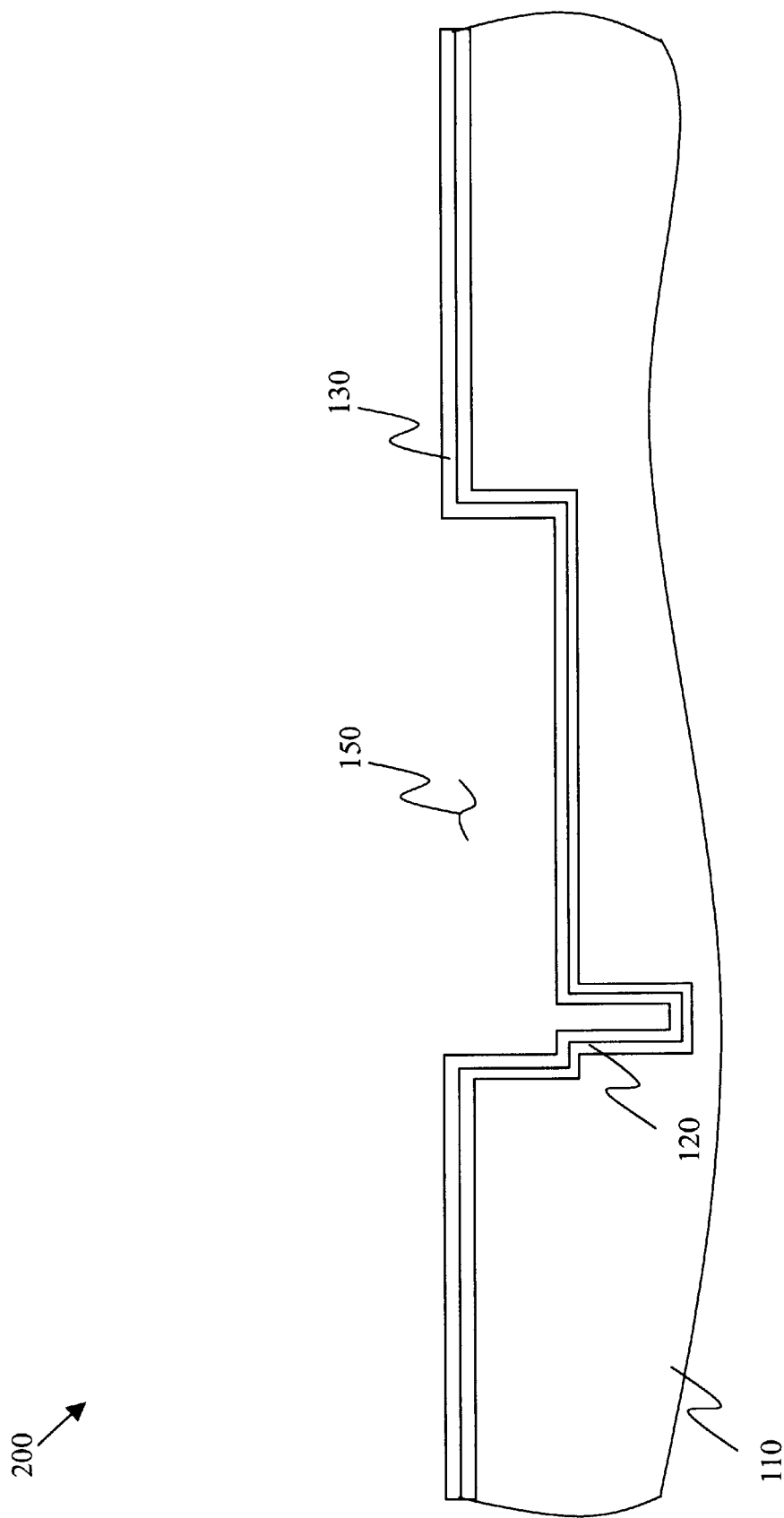
FIG. 2A illustrates a partial sectional view of a partially completed electroplated interconnect structure, including a dual damascene trench, a barrier layer and a seed layer.
Figure 2B:
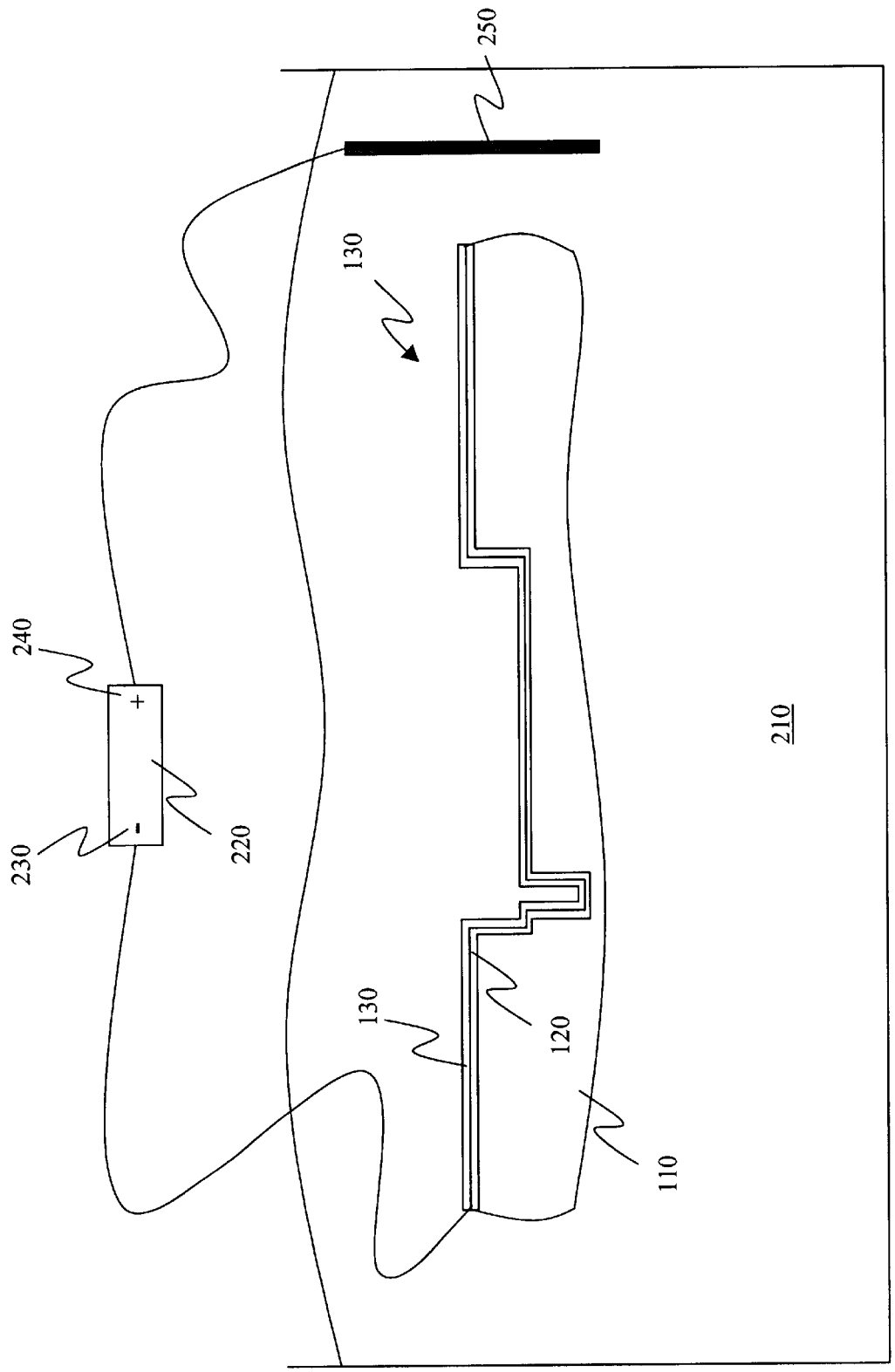
FIG. 2B illustrates the partially completed electroplated interconnect structure as illustrated in FIG. 2A, within an aqueous electroplating solution covered by the present invention.

Turning to FIGS. 2A–2C, illustrated are various phases of the fabrication of the completed electroplated interconnect structure 100 shown in FIG. 1. FIG. 2A illustrates a partial sectional view of a partially completed electroplated interconnect structure 200 covered by the present invention. The electroplated interconnect structure 200 includes the conventionally formed dual damascene opening 150. After the formation of the opening 150, the barrier layer 120 is deposited. The barrier layer 120 may be conformally deposited using a conventional chemical vapor deposition (CVD) process, physical vapor deposition (PVD) process or other known deposition process. Furthermore, the barrier layer 120 may comprise tantalum/tantalum nitride, titanium/titanium nitride, tantalum/tantalum silicon nitride, titanium/titanium silicon nitride or any other material suitable for preventing diffusion from occurring between the electroplated copper layer 140 (FIG. 1) and the dielectric layer 110. As illustrated, the barrier layer 120 is only one layer; however, one having skill in the art knows that, depending on the device design, the barrier layer 120 may comprise multiple barrier layers or no barrier layer at all.

The seed layer 130 may then be conventionally deposited over the barrier layer 120. The seed layer 130 can be used to carry the cathodic current required for the electrodeposition of the electroplated copper layer 140 (FIG. 1). In general, elements chosen from the Groups 1B, III, IV, and VIII, with bulk resistivities less than 100 $\mu\Omega$-cm are best used for the seed layer 130. Copper has emerged as a preferred metal from this group, however, other metals from the above-reference group may also be used.

FIG. 2B illustrates the partially completed electroplated interconnect structure depicted in FIG. 2A, within an aqueous electroplating solution 210. In a preferred embodiment, the aqueous electroplating solution 210 comprises a copper salt, such as copper sulfate. The copper salt preferably comprises a weight by weight percent of the electroplating solution 210 ranging from about 0.1% and to about 2.5%. More preferably, however, the copper salt comprises a weight by weight percent of the electroplating solution 210 of about 0.3%.

The aqueous electroplating solution 210 also includes an acid that may be any of a number of strong acids, including inorganic acids or organic acids that have disassociation constant about equal to or less than sulfuric acid (i.e., a pKa of about 2.0). However, in a preferred embodiment, the acid is an inorganic acid, and is more preferably sulfuric acid. The acid may comprise a weight by weight percent of the electroplating solution 210 of ranging from about 0.1% and to about 10%. However, the acid, in a most preferred embodiment, has a weight by weight percent of the aqueous electroplating solution 210 of about 0.08%.

The aqueous electroplating solution 210 also includes a hydrogenated halide. The hydrogenated halide may be a hydrogen bromide, hydrogen chloride, hydrogen iodine or any other similar halide, and may comprise a weight by weight percent of the aqueous electroplating solution of ranging from about 0.0001% and to about 1%, and in a preferred embodiment is about 0.001%.

The aqueous electroplating solution 210 also includes a modulator, which helps with the grain refinement of the electrodeposited copper layer and helps to passivate the copper surface from oxidation. However, there is an optimum window for the concentration of the modulator, since the additives segregate to the surface of the electrodeposited copper film and adversely impact interfacial adhesion. Thus, the modulator preferably comprises a weight by weight percent of the aqueous electroplating solution 210 of ranging from about 0.0001% and to about 1%, and preferably is less than about 0.01%.

As discussed below, the modulator may be a brightener or a leveler or may include both. Thus one embodiment provides a solution that includes a brightener. It is believed that the brightener helps control the electron exchange between the copper atoms and the surface of the seed layer or the thermodynamics of the electroplating process. In such embodiments, the brightener may comprise a number of compositions, such as formaldehyde, urea, beta-diketonates, thiourea, diamino-urea, thiophene. In one preferred embodiment, however, the brightener is a derivative of 2,2'-thiobisalkyl acetoacetate or 2,2'-aminobisalkyl having a general formula: $(X-[CH_2(CH_2)_n-O-C(O)CH_2C(O)CH_3]_2)$, where X=S or N respectively; however, the 2,2'-thiobisalkyl acetoacetate may be 2,2'-thiobisethyl acetoacetonate, when X=S and n=2. Furthermore, the 2,2'-aminobisalkyl acetoacetate may be 2,2'-aminobisethyl acetoacetonate, when X=N and n=2. In a more preferred embodiment, the brightener comprises an alkylthiol, such as $C_5H_{13}SH$ or $C_8H_{17}SH$. However, other brighteners having similar properties to those discussed above may also be used.

The modulator, in another embodiment, is a leveler. It is believed that the leveler helps control the kinetics of the copper electrodeposition. In one aspect of this particular embodiment, the leveler includes the brightener and a water soluble polymer. The water soluble polymer may be a polyalcohol, or more specifically saturated and unsaturated aliphatic polyalcohols, e.g. a polyalkylene glycol. In another embodiment, the modulator includes both the brightener and the leveler, wherein the combination comprises a weight by weight percent of the electroplating solution of less than about 0.01%.

Those who are skilled in the art understands the basic principle of the electroplating process; however, for clarity the process will be addressed briefly with reference to FIG. 2B. As illustrated in FIG. 2B, the seed layer 130 (cathode) is connected to a negative terminal 230 of a low current source 220. Likewise, a source material (anode) 250 is connected to the positive terminal 240 of the low current source 220. The entire seed layer 130 and the source material 250 are submerged into the aqueous electroplating solution 210, and an electrical potential is established between the seed layer 130 and the source material 250. The resulting electrical field initiates electrophoretic migration of the source material 250 from the anodes to the electrically conductive surface of the cathode where the ionic charge is neutralized as the metal ions plate out of the solution. The design of the device dictates what source material 250 is used; however, for electroplated copper interconnects, copper is normally used as the source material 250.

FIG. 2C illustrates the completed electroplated interconnect structure 100 after the electroplated copper layer 140 has been formed, and layers 120, 130, 140, have been polished back with a chemical/mechanical polishing (CMP) process. The electroplated interconnect structure 100 theoretically may be located on any level within an integrated circuit (IC). If the electroplated interconnect structure 100 is used on the upper level of an IC, an under bond metalization pad 140 (FIG. 1) would be conventionally deposited thereon. However, if the electroplated interconnect structure 100 were to be located on an underlying level, a plug structure would normally be formed within an overlying dielectric layer such that the interconnect would be connected to other levels.

The electroplated copper layer 140, as a result of the aqueous electroplating solution used, theoretically has superior mechanical properties, such as yield strength and adhesion strength. The increased yield and adhesion strength of the electroplated copper layer 140 is of substantial importance when used as the outermost copper interconnect layer. Specifically, the adhesion at the UBM/copper interconnect layer and the copper interconnect layer/dielectric interface is robust. Furthermore, the modulator in the electroplating solution passivates the electroplated copper interconnect from oxidation.

Turning to FIG. 3, illustrated are the completed electroplated interconnect structures 100, located within a conventional integrated circuit (IC) 300. As illustrated, the electroplated interconnect structures 100 may be located on the upper level 310 of the IC or an intermediate level 320 of the IC. One who is skilled in the art understands that the electroplated interconnect structure 100 of the present invention, including the electroplate copper layer 140, may comprise as many or as few of the interconnects that make up the IC 300; thus, the IC 300 could comprise all electroplated copper interconnect structures 100 or could comprise some electroplated copper interconnect structures 100 and some interconnect structures comprising other conductive materials 330.

Also illustrated in FIG. 3, is a conventional transistor 340, such as a complementary metal oxide semiconductor (CMOS) transistor or bipolar CMOS transistor. As illustrated, the transistor 340 is located on a semiconductor wafer substrate 345, and may be connected to various levels 310, 320, by interconnects 100, 330, and contacts or vias 350, all of which are formed within dielectric layers 355. It is well known how to basically fabricate the transistors 340, contacts or vias 350, and the dielectric layers 355, and the method of fabricating the interconnects 100, which is not conventional, has been described in detail above. Furthermore, it is also understood that only a partial sectional view of the IC is illustrated, and that multiple interconnects 100, 330, transistors 340 and dielectric layers 355, are typically combined to form a complete IC.

Although the present invention has been described in detail, those skilled in the art should understand that they can make various changes, substitutions and alterations herein without departing from the spirit and scope of the invention in its broadest form.

What is claimed is:

1. A method of fabricating an integrated circuit on a semiconductor wafer, comprising:

forming transistors on a semiconductor wafer;

forming a dielectric layer over the transistors;

forming an opening dielectric layer;

placing the semiconductor wafer into an aqueous electroplating solution, including:

a copper salt;

an acid having a dissociation constant of less than about 2.0;

a hydrogenated halide; and a modulator comprising a weight by weight percent of the electroplating solution of about less than 1% and wherein said modulator includes a brightener that includes a derivative of 2,2'-thiobisalkyl acetoacetate having a general formula:

$(X-[CH_2(CH_2)_2-O-C(O)CH_2C(O)CH_3]_2)$, where X=S or N;

electroplating copper in the opening; and interconnecting the transistors to form an operative integrated circuit.

2. The method as recited in claim 1 wherein the copper salt comprises a weight by weight percent of the electroplating solution that ranges from about 0.1% to about 2.5%, the acid is an inorganic acid that comprises a weight by weight percent of the electroplating solution that ranges from about 0.1% to about 10%, the hydrogenated halide comprises a weight by weight percent of the electroplating solution that ranges from about 0.0001% to about 1%, and the modulator comprises a weight by weight percent of the electroplating solution that ranges from about 0.0001% to about 1%.

3. The method as recited in claim 2 wherein the brightener includes an acidic aqueous solution selected from the group consisting of formaldehyde, urea, beta-diketonates, thiourea, diamino-urea, and thiophene.

4. The method as recited in claim 1 wherein the brightener includes an acidic aqueous solution comprising an alkylthiol having a general formula:

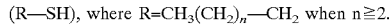

(R—SH), where R=CH$_3$(CH$_2$)$_n$—CH$_2$ when n≥2.

5. The method as recited in claim 1 wherein the modulator includes a leveler.

6. The method as recited in claim 1 wherein the modulator is a mixture of a brightener and a leveler and wherein the mixture comprises a weight by weight percent of the electroplating solution less than about 0.01%.

7. The method as recited in claim 6 wherein the leveler includes the brightener and a water soluble polymer.

8. The method as recited in claim 7 wherein the water soluble polymer is a polyalcohol.

9. The method as recited in claim 8 wherein the polyalcohol is a polyalkylene glycol.

10. The method as recited in claim 1 wherein the copper salt is copper sulfate.

11. The method as recited in claim 10 wherein the copper sulfate comprises a weight by weight percent of the electroplating solution of about 0.3%.

12. The method as recited in claim 1 wherein the acid is sulfuric acid.

13. The method as recited in claim 12 wherein the sulfuric acid comprises a weight by weight percent of the electroplating solution of about 0.08%.

14. The method as recited in claim 1 wherein the hydrogenated halide is hydrogen bromide, hydrogen chloride, or hydrogen iodine.

15. The method as recited in claim 14 wherein the hydrogenated halide comprises a weight by weight percent of the electroplating solution of about 0.001%.

16. The method as recited in claim 1 wherein forming an opening in the dielectric layer further includes depositing a barrier layer within the opening.

17. The method as recited in claim 16 wherein depositing a barrier layer includes depositing a barrier layer of tantalum/tantalum nitride or titanium/titanium nitride.

18. The method as recited in claim 16 wherein depositing a barrier layer within the opening further includes depositing a copper seed layer on the barrier layer.

19. The method as recited in claim 1 wherein forming transistors includes forming complementary metal oxide semiconductor (CMOS) transistors or bipolar transistors.

20. The method as recited in claim 1 wherein the brightener is a derivative of 2,2'-aminobisalkyl acetoacetate having a general formula:

(X—[CH$_2$(CH$_2$)$_2$—O—C(O)CH$_2$C(O)CH$_3$]$_2$), where X=N.

* * * * *